US012015905B2

(12) United States Patent
Harrell

(10) Patent No.: US 12,015,905 B2
(45) Date of Patent: Jun. 18, 2024

(54) BELT-TYPE WEARABLE DEVICE, SYSTEM, AND METHOD FOR MULTIMEDIA COMMUNICATIONS

(71) Applicant: Eric Harrell, Irving, TX (US)

(72) Inventor: Eric Harrell, Irving, TX (US)

( * ) Notice: Subject to any disclaimer, the term of this patent is extended or adjusted under 35 U.S.C. 154(b) by 119 days.

(21) Appl. No.: 17/673,373

(22) Filed: Feb. 16, 2022

(65) Prior Publication Data

US 2022/0182761 A1 Jun. 9, 2022

Related U.S. Application Data

(63) Continuation of application No. 15/700,069, filed on Sep. 8, 2017, now Pat. No. 9,936,296.

(51) Int. Cl.

| | |
|---|---|
| ***H04R 1/10*** | (2006.01) |
| ***H04R 1/02*** | (2006.01) |
| ***H04R 5/033*** | (2006.01) |
| ***H10K 59/00*** | (2023.01) |

(52) U.S. Cl.

CPC ........... *H04R 5/0335* (2013.01); *H04R 1/105* (2013.01); *H04R 5/033* (2013.01); *H10K 59/00* (2023.02); *H04R 1/028* (2013.01); *H04R 1/1008* (2013.01); *H04R 1/1025* (2013.01)

(58) Field of Classification Search

CPC ...... H04R 5/0335; H04R 1/105; H04R 5/033; H04R 1/028; H04R 1/1008; H04R 1/1025; H10K 59/00

USPC ........................................................... 381/74

See application file for complete search history.

(56) References Cited

U.S. PATENT DOCUMENTS

2014/0036127 A1* 2/2014 Pong ...................... H04R 1/028 348/333.01

* cited by examiner

*Primary Examiner* — Paul Kim

(57) ABSTRACT

A wearable device for multimedia communications is disclosed herein. The device includes a power supply, a stereo communication link, and a belt with a buckle. The stereo communication link is configured to communicate at least one of audio signals and video signals over a channel. The belt with a buckle includes a housing, capturing means affixed to the housing, a sound output means affixed to the housing, and a display affixed to the housing. The capturing means adapted to record video. The sound output means configured to play audio responsive to the audio signals communicated over the channel. The display configured to play video responsive to the video signals communicated over the channel.

19 Claims, 4 Drawing Sheets

BELT-TYPE WEARABLE DEVICE, SYSTEM, AND METHOD FOR MULTIMEDIA COMMUNICATIONS

CROSS-REFERENCE TO RELATED PATENT APPLICATION

This application is a continuation-in-part of U.S. application Ser. No. 15/700,069 filed on Sep. 8, 2017, titled "Device, system, and method for multimedia communications" now U.S. Pat. No. 9,936,296. This application and the patent is incorporated herein by reference in its entirety.

BACKGROUND

Field of Invention

The present invention generally relates to the wearable telecommunications platforms, and more particularly, to a belt-type wearable device, system, and method for multimedia communications.

Description of Related Art

The need for personal audio headsets continues to rise as consumer devices become more widespread in modern life. A recent spike in the design and development of multimedia communication device has occurred in response to increased demand. Indeed, the multimedia communication device manufacturers are constantly looking for new and improved designs and features that will appeal to customers.

Belts with buckles are well-known connectors, securers of items, and worn by a user. Many well-known buckle designs have been documented previously. Conventional, multimedia communication devices of variant type are not portable and lack multimedia communication advantages.

A traditional multimedia communication device, system, or method has a number of drawbacks, including the fact that all of the components do not sync the multimedia being displayed on various system components. Furthermore, a traditional multimedia communication device, system, or technique lacks sound output and does not show content on any of the system's components, instead adding to the system's complexity.

Current multimedia communication device or system have the drawback of allowing the user to access only one audio input signal at a time, with limited control over listening preferences and display capabilities. There is still a demand for a belt-type multimedia communication device that allows for more control and listening options. This is especially true in today's industry, when technology capabilities and customisation options are constantly expanding.

The references to and descriptions of past devices, systems or methods made above are not intended to be, and should not be interpreted as, claims or confessions of widespread general knowledge in the art. The preceding prior art discussion, in particular, does not pertain to what is frequently or well known by a person versed in the art, but rather aids in the comprehension of the inventive step of the present invention, of which the identification of appropriate previous art proposals is just one element.

SUMMARY

In view of the foregoing disadvantages inherent in the known telecommunications platforms art, the present disclosure provides a novel wearable device, system, and method for multimedia communications. The general purpose of the present disclosure, which will be described subsequently in greater detail, is to provide a wireless communications device with a digital display and enhanced user controls.

Embodiments in accordance with the present invention provides a wearable device for multimedia communications. The device for multimedia communications may include a power supply. The device for multimedia communications further includes a stereo communication link that may be configured to communicate at least one of audio signals and video signals over a channel. The device for multimedia communications may include a stereo communication link configured to communicate at least one of audio signals and video signals over a channel. The device also includes a belt with a buckle that further includes a housing. The belt with the buckle also includes a capturing means affixed to the housing, the capturing means adapted to record video. The belt with the buckle also includes a sound output means affixed to the housing, the sound output means configured to play audio responsive to the audio signals communicated over the channel. Further, display may be affixed to the housing and the display is configured to play video responsive to the video signals communicated over the channel.

In one embodiment of the present invention, the stereo communications link may include a wireless transceiver configured to receive the at least one of the audio signals and the video signals from a signal source physically decoupled from the device.

Embodiments in accordance with the present invention provides a system for multimedia. The system for playing multimedia may include a multimedia communications device that may further include a power supply, a stereo communication link, a controller including a user interface, and a belt with a buckle. The controller further configured as a telephony device. The controller may be configured to communicate audio and video signals to the multimedia communications device.

In one of the embodiment of the present invention, the belt buckle may be adapted to record video via a capturing means and display images and videos played here on the controller including the user interface to a display of the belt buckle. Moreover, the belt buckle further includes a sound output means for playing audio and video.

In an embodiment of the present invention, the capturing means may be a camera and the sound output means may be a built-in speaker in the belt buckle.

In one embodiment of the present invention, the wireless transceiver is configured to make a Bluetooth connection.

In the embodiments, the belt buckle may be incorporated as wearable in wrist or waist belt or any other form that may be decided by users.

Embodiments in accordance with the present invention provides a method for playing multimedia. The method for playing multimedia may include providing a multimedia communications device such as discussed above, providing a controller, such as discussed above, including a user interface, communicably coupling the multimedia communications device with the controller, communicating audio signals and video signals from the controller to the multimedia communications device. The method includes playing left audio signals on the sound output means. The method also includes playing video signals on the display. The method further includes playing audio signals on the sound output means. The method also includes adapting a belt with a buckle to record video via a capturing means and display images and videos played here on the controller including the user interface to the display of the belt buckle. The belt buckle further comprising a sound output means for playing audio and video. The method also includes conducting a phone call via the to the multimedia communications device.

For purposes of summarizing the invention, certain aspects, advantages, and novel features of the invention have been described herein. It is to be understood that not necessarily all such advantages may be achieved in accordance with any one particular embodiment of the invention. Thus, the invention may be embodied or carried out in a manner that achieves or optimizes one advantage or group of advantages as taught herein without necessarily achieving other advantages as may be taught or suggested herein. The features of the invention which are believed to be novel are particularly pointed out and distinctly claimed in the concluding portion of the specification. These and other features, aspects, and advantages of the present invention will become better understood with reference to the following drawings and detailed description.

These and other advantages will be apparent from the present application of the embodiments described herein.

The preceding is a simplified summary to provide an understanding of some embodiments of the present invention. This summary is neither an extensive nor exhaustive overview of the present invention and its various embodiments. The summary presents selected concepts of the embodiments of the present invention in a simplified form as an introduction to the more detailed description presented below. As will be appreciated, other embodiments of the present invention are possible utilizing, alone or in combination, one or more of the features set forth above or described in detail below.

BRIEF DESCRIPTION OF THE DRAWINGS

The above and still further features and advantages of embodiments of the present invention will become apparent upon consideration of the following detailed description of embodiments thereof, especially when taken in conjunction with the accompanying drawings, and wherein.

Figure 1A:
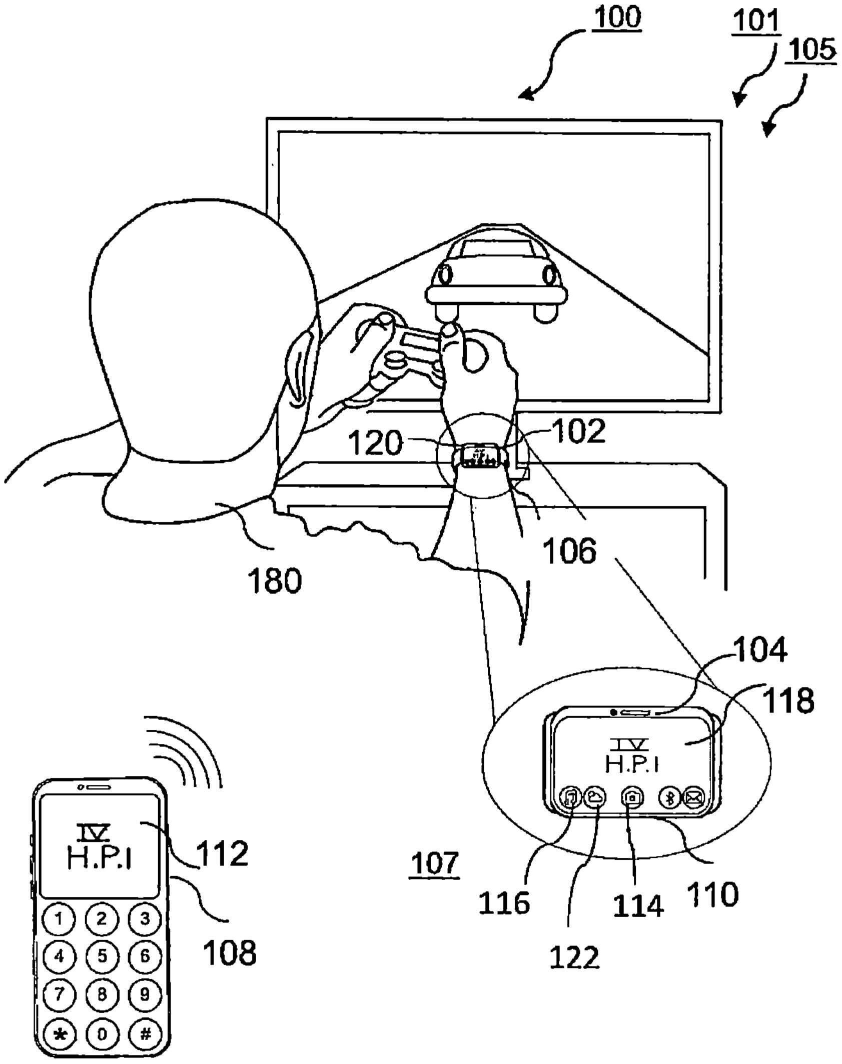
FIG. 1A illustrates a perspective view of a wearable device for multimedia communications during an 'in-use' condition, according to embodiments of the present invention disclosed herein.

The headings used herein are for organizational purposes only and are not meant to be used to limit the scope of the description or the claims. As used throughout this application, the word "may" is used in a permissive sense (i.e., meaning having the potential to), rather than the mandatory sense (i.e., meaning must). Similarly, the words "include", "including", and "includes" mean including but not limited to. To facilitate understanding, like reference numerals have been used, where possible, to designate like elements common to the figures. Optional portions of the figures may be illustrated using dashed or dotted lines, unless the context of usage indicates otherwise.

DETAILED DESCRIPTION

The following description includes the preferred best mode of one embodiment of the present invention. It will be clear from this description of the invention that the invention is not limited to these illustrated embodiments, but the invention also includes a variety of modifications and embodiments thereto. Therefore, the present description should be seen as illustrative and not limiting. While the invention is susceptible to various modifications and alternative constructions, it should be understood, that there is no intention to limit the invention to the specific form disclosed, but, on the contrary, the invention is to cover all modifications, alternative constructions, and equivalents falling within the spirit and scope of the invention as defined in the claims.

In any embodiment described herein, the open-ended terms "comprising," "comprises," and the like (which are synonymous with "including," "having" and "characterized by") may be replaced by the respective partially closed phrases "consisting essentially of," consists essentially of," and the like or the respective closed phrases "consisting of," "consists of, the like.

As used herein, the singular forms "a", "an", and "the" designate both the singular and the plural, unless expressly stated to designate the singular only.

The present invention relates to a telecommunications platform and more particularly to a belt-type wearable device, system, and method for multimedia communications as used to improve wireless communications devices by providing a digital display, independent operations, and enhanced user controls.

As used herein, 'means' or 'portions' refers to a device, a system, a hardware, a computer application configured to execute specific functions or instructions according to the embodiments of the present invention. The means or portions may include a single device or multiple devices configured to perform specific functions according to the present invention disclosed herein.

Figure 1B:
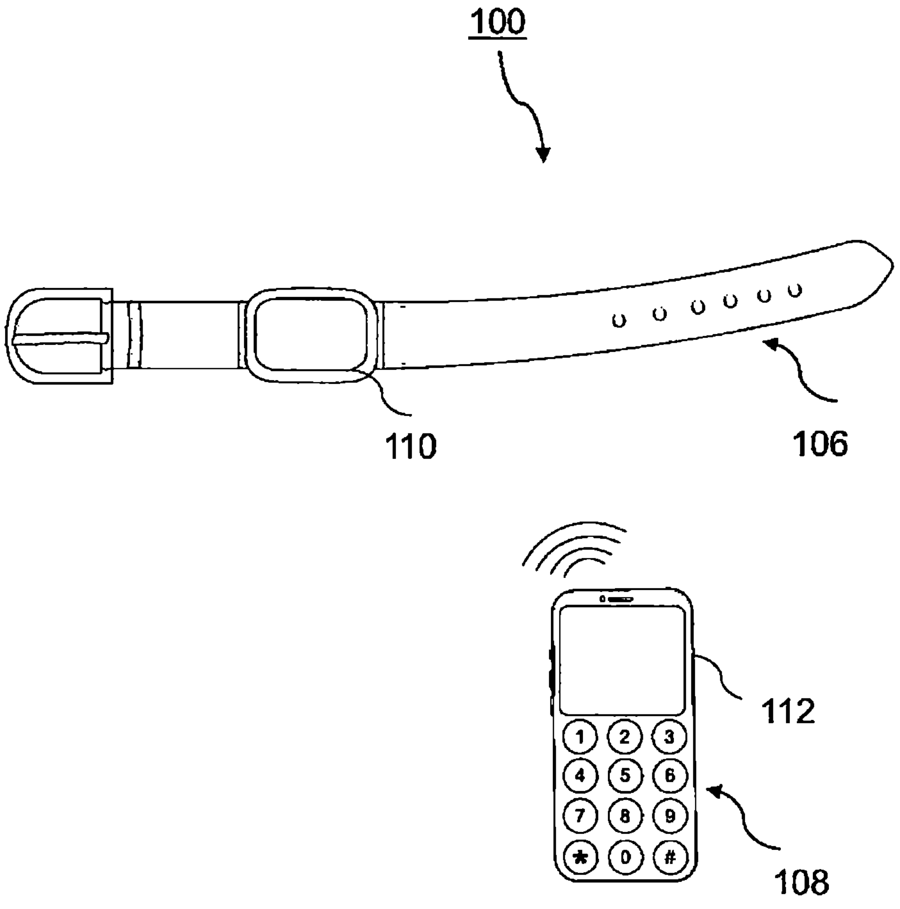
FIG. 1B illustrates a perspective view of the wearable device for multimedia communications associated with a controller of FIG. 1A, according to embodiments of the present invention disclosed herein.
Figure 1C:
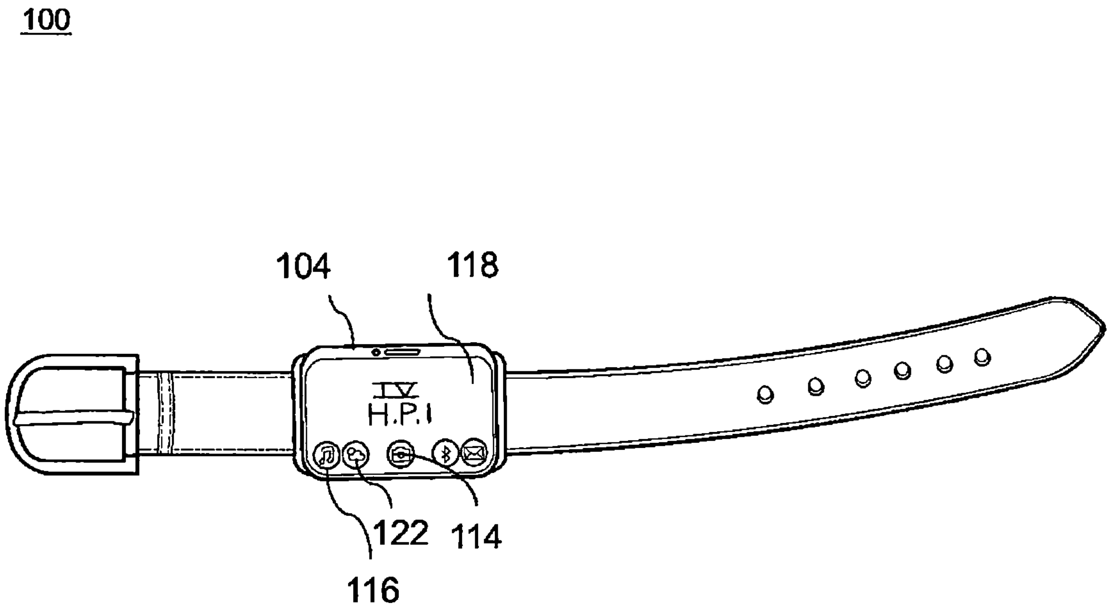
FIG. 1C illustrates a perspective view of the wearable device for multimedia communications of FIG. 1A, according to embodiments of the present invention disclosed herein.

Referring now more specifically to the drawings by numerals of reference, there is shown in FIGS. 1A, 1B, and 1C various views of a device 100 for multimedia communications. FIG. 1 shows the device 100 for multimedia communications ("multimedia communications device") during an 'in-use' condition, according to an embodiment of the present disclosure. As shown, the multimedia communication device 100 may be beneficial for use by a user to play multimedia and communicate via a system having independent channels and enhanced controls. Further, the device 100 for multimedia communications may comprise a power supply 102, a stereo communication link 104, a belt with a buckle 106, a controller 108. One or both of the power supply 102 and the stereo communication link 104 may be incorporated in or otherwise housed by the device 100, as shown here. The stereo communication link 104 may be configured to communicate at least one of audio signals and video signals over a channel. In an embodiment of the present invention, the sound output means 116 are configured to switch between communicating audio signals and video signals.

According to one embodiment of the disclosure, the multimedia communications device 100 may be included in a system 101 for playing multimedia. The system 101 may further include a controller 108 that is configured to communicate at least one of audio signals and video signals to the multimedia communications device 100. The controller 108 may include a user interface 112, for example a plurality of tactile features (e.g., button), a touch pad, etc., which may be configure to operate one or more functions of the multimedia communications device 100.

According to one embodiment, the controller 108 may be a telephony device, or otherwise configured to communicate with another remote communication device. In a preferred embodiment, the controller 108 may be embodied as or operable from a mobile communication device, such as a cell phone, smart phone, or the like.

According to embodiments of the present invention, the controller 108 may be, but not limited to, a mobile device, a smart phone, a tablet computer, a portable computer, a laptop computer, a desktop computer, a smart device, a smart watch, a smart glass, and so forth. Embodiments are intended to include or otherwise cover any type of the first controller 108, including known, related art, and/or later developed technologies.

According to one embodiment, the multimedia communications device 100 may be arranged as a kit 105. In particular, the device 100 for multimedia communications may further include a set of instructions 107. The instructions 107 may detail functional relationships in relation to the structure of the multimedia communications device 100 such that the multimedia communications device 100 can be used, maintained, or the like, in a preferred manner.

In an embodiment of the present invention, the system 101 may further comprises set of instructions and the device 100 may be arranged as a kit.

Aspects of embodiments are aimed towards a short-range radio protocol sound device in general (e.g., Bluetooth). The device may be a combination of a listening device and a digital display with software controls to improve the listening experience. It is essentially an over-the-wrist or over-the-waist device in one embodiment, but it can be removed to view the display if required. It may be used as a stereo to listen to music, or it may be configured to have independent audio and graphic sources for the belt with a buckle.

In one embodiment of the present invention, the device 100 may include a microphone in the housing to allow multiple people to participate in the conversation. For example, one user may use the sound output means to listen to an audiobook or audio input or another source on your smartphone device. The sources may be simply customised using a bespoke interface on a smartphone device using a handy mobile app. The user may also be able to select customised visuals to be displayed on the outer surface of each earpiece via the mobile application. Audio sources (such as phone conversations, audiobooks, stored music, and streaming radio services) may be sent to sound output means 116 which may be a speaker.

FIG. 1B illustrates a schematic representation of the wearable device 100 for multimedia communications associated with the controller 108 of FIG. 1A, according to an embodiment of the present disclosure. As above, the multimedia communications device 100 may comprise the belt associated with a buckle 104 for securing the device around the wrist or waist of a user. The belt may include a plurality of holes for securing buckle components. In an embodiment of the present invention, the microphone may be configured to communicate a microphone signal over the channel.

As above, the stereo communication link 104 may be configured to communicate at least one of audio signals and video signals over the channel. Each channel may include wired portions, wireless portions, or a combination thereof. According to exemplary aspects of the present invention, the controller 108 may be coupled via the wireless portions. A data network, such as the Internet, a Local Area Network (LAN), a Wide Area Network (WAN), a Metropolitan Area Network (MAN), and so on, may be included in the wireless portions. In an embodiment of the present invention, the stereo communication link includes a wireless portion configured to wirelessly communicate the at least one of audio signals and video signals over the channel to at least one of the headgear.

The wireless portions of some implementations of the present invention may include a wireless network, such as, but not limited to, a cellular network, and may use various technologies such as Enhanced Data Rates for Global Evolution (EDGE), General Packet Radio Service (GPRS), and so on. The wireless portions of the present invention may comprise or cover networks or sub-networks, each of which may contain, for example, a wired network.

As shown here, according to one embodiment, the stereo communication link 108 may include a wireless transceiver 120 configured to receive the audio signals and video signals from a signal source 10 (e.g., computer, tablet, media player, smart TV, video game, mobile phone, digital radio, to name a few) that is physically decoupled from the multimedia communications device 100.

In an embodiment of the present invention, a wired connector may be communicably coupled to the stereo communication link. The wired connector may include a USB connection configured to transfer data and power to the device 100. Further, the device 100 may comprise the user interface 112 that may be configured to operate the device 100. The stereo communication link may include a wireless portion configured to wirelessly communicate the at least one of audio signals and video signals over the channel to a controller including a user interface.

The multimedia communications device 100 may further include a processor 121 and a storage means 122 for storm audios and videos, and a local user interface. As used herein, the storage means 122 may be a 'memory' that refers to a local or remote memory device or a database capable to store metadata. In an embodiment, the memory may be a database server, a cloud storage, a remote database, a local database.

The processor 124 may be configured to perform various functions such as process and segregate signalling to and from the device 100 to a controller 108, and distribute power from the power supply 102.

As used herein, 'processor 124' is an intelligent device or module, that is capable of processing digital logics and also possesses analytical skills for analysing and processing various metadata and user related data or information, according to the embodiments of the present disclosure. The processing unit may also refer to any computer processing unit comprising, but not limited to, a single-core processor, a multi-core processor.

The processor 121 may also be configured to drive the sound output means 116, the display 126. The memory may be communicably coupled to the processor 124 and configured to store operation/control information and/or content to be played over the sound output means 116. The display 118 may be configured to exhibit both still and video images.

The local user interface may include a plurality of tactile features (e.g., button), a touch pad, etc., which may be configure to operate one or more functions of the multimedia communications device 100. According to one embodiment, the device 100 may be independently powered and controlled. In an embodiment of the present invention, the user interface 112 may be further configured to play independent audio and video content in the sound output means 116. Further, the user interface 112 may be physically decoupled from the housing.

According to one embodiment, the multimedia communications device 100 may further include may further include the microphone that may be configured to communicate a microphone signal. For example, the a microphone may be coupled to the housing 110, for example, and further configured to communicate the microphone signal over at least one of the channel.

FIG. 1C illustrates a perspective view of the wearable device 100 for multimedia communications of FIG. 1A, according to an embodiment of the present invention. Shown here is the belt with a buckle 106 may include the stereo communication link 104 (shown as a non-wired connection).

According to one embodiment, the multimedia communication device 100 may be configured for a wired connector. As shown, the wired connector may be communicably coupled to the stereo communication link 104. According to one embodiment, the wired connector may include a standardized and/or powered connector, such as a USB connection, configured to transfer data and power to the device 100.

The belt with a buckle 106 may be associated with the controller 108 of the system 100. According to embodiments of the present invention, the controller 108 may be such as, but not limited to, a mobile communication device which may be a smartphone. The belt with the buckle 106 may comprise the display 118 that may be configured to display images or videos. In an embodiment of the present invention, the belt with the buckle 106 may be adapted to record video via a capturing means. In a preferred embodiment of the present invention, the capturing means may be a camera. Further, the belt with the buckle 106 may display images and videos played here on the controller 108 including the user interface 112 to the display 118. Furthermore, the belt with a buckle 106 may further comprise the sound output means for playing audio and video. In an exemplary scenario, the audio signals and the video signals may be communicated to the belt buckle screen (display 118) and the multimedia communications device 100 via the controller 108. The belt with the buckle 106 may comprise a plurality of holes for securing the belt as required by the user. In an preferred embodiment of the present invention, the controller 108 may be the smart phone or a user device. Notably, the user device may be connected through the communication network, according to embodiments of the present invention.

The communication network may include a data network such as, but not limited to, an Internet, a Local Area Network (LAN), a Wide Area Network (WAN), a Metropolitan Area Network (MAN), and so forth. In some embodiments of the present invention, the communication network may include a wireless network, such as, but not limited to, a cellular network and may employ various technologies including an Enhanced Data Rates for Global Evolution (EDGE), a General Packet Radio Service (GPRS), and so forth. In some embodiments of the present invention, the communication network may include or otherwise cover networks or subnetworks, each of which may include, for example, a wired or a wireless data pathway.

According to embodiments of the present invention, the user device (controller 108) may be configured to communicate with each other by one or more communication mediums connected to the communication network. The communication mediums include, but are not limited to, a coaxial cable, a copper wire, a fiber optic, a wire that comprise a system bus coupled to a processor of a computing device, and so forth. Embodiments of the present invention are intended to include or otherwise cover any type of the communication mediums, including known, related art, and/or later developed technologies.

Figure 2:
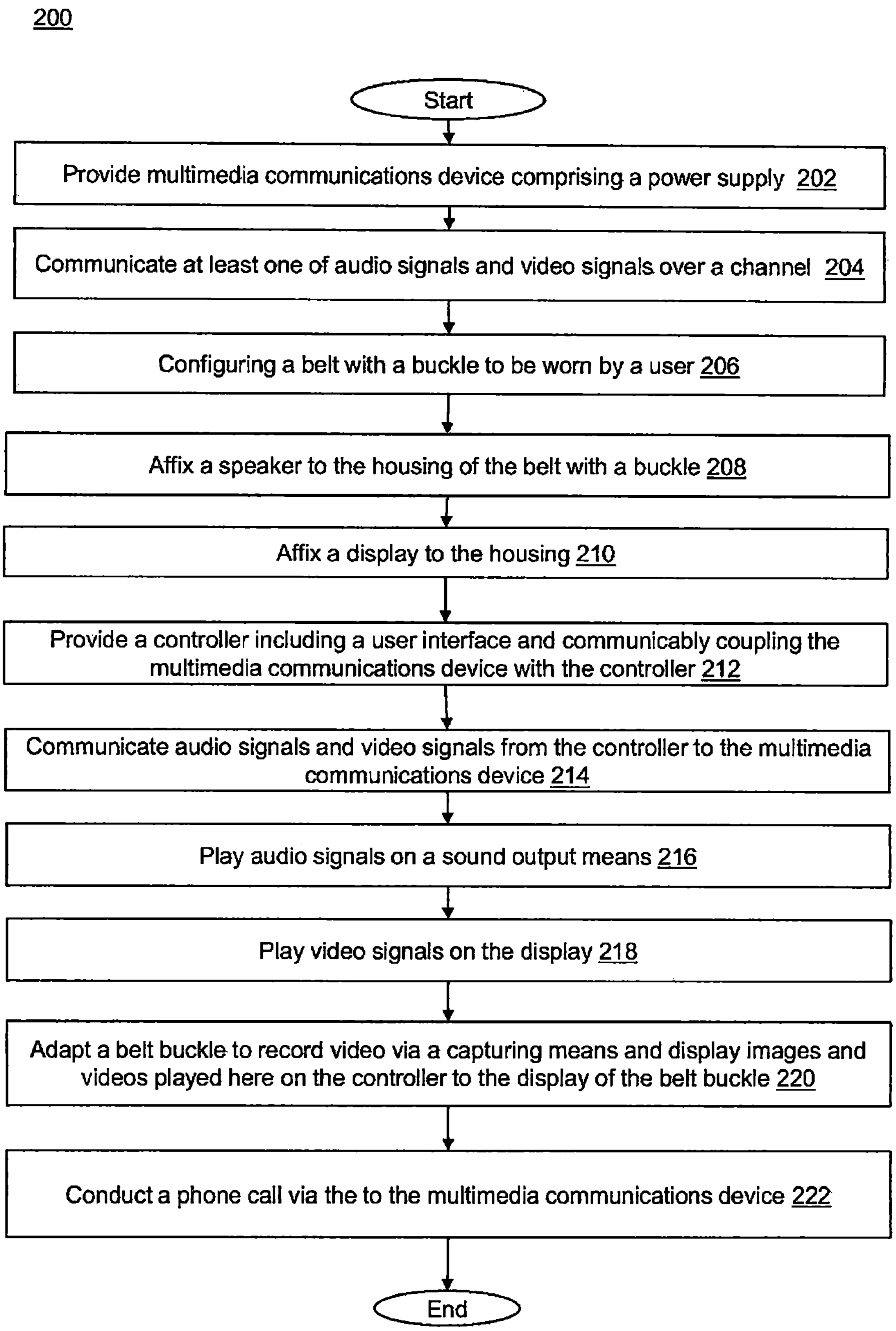
FIG. 2 illustrates a flowchart of a method for playing multimedia on the wearable device, according to embodiments of the present invention disclosed herein.

In an exemplary embodiment of the present invention, the user interface 112 may be configured to operate the device 100. Further, the user interface 112 may be voice operated and the user interface 112 is further configured to operate the capturing means 114, which may be a camera to record and capture the video FIG. 2 illustrates a flowchart of a method 200 for playing multimedia on the wearable device, according to embodiments of the present invention.

At 202, the method 600 for playing multimedia may include one or more components or features of the device 100 for multimedia communications as described above. The method 200 may provide a multimedia communications device comprising the power supply 102 and the method 200 may go ahead to 204.

At 204, the method 200 for playing multimedia may communicate at least one of audio signals and video signals over the channel through the stereo communication link 104.

At 206, the method 200 for playing multimedia may configure the belt with a buckle 106. The belt with the buckle 106 may be worn by a user. Further, the belt with the buckle 106 may include the housing 110.

At 208, the method 200 for playing multimedia may comprise the speaker 116 affixed to the housing to play audio responsive to the audio signals communicated over the channel.

At 210, the method 600 for playing multimedia may affix the display 118 to the housing 104. In an embodiment of the present invention. In an embodiment of the present invention, the display 118 may be configured to play video responsive to the video signals communicated over the channel.

At 212, the method 200 for playing multimedia may provide a controller 108 including the user interface 112. The controller 108 may be configured to communicate the at least one of audio signals and video signals to the multimedia communications device 100 and further configured as a telephony device. In an embodiment of the present invention, the multimedia communications device 100 may be communicably coupled with the controller 112.

At 214, the method 200 for playing multimedia may communicate audio signals and video signals from the controller 108 to the multimedia communications device 100.

At 216, the method 200 for playing multimedia may play audio signals on the sound output means 116.

At method 218, the method 200 for playing multimedia playing video signals on the display.

At 220, the method 200 for playing multimedia may adapt the belt buckle 106 to record video via the capturing means 114 and display images arid videos played here on the controller 108 including the user interface 112 to the display of the belt buckle 104.

At 222, the method 200 for playing multimedia may conduct a phone call via the to the multimedia communications device 100.

The embodiments of the invention described herein are exemplary and numerous modifications, variations and rearrangements can be readily envisioned to achieve substantially equivalent results, all of which are intended to be embraced within the spirit and scope of the invention. Further, the purpose of the foregoing abstract is to enable the U.S. Patent and Trademark Office and the public generally, and especially the scientist, engineers and practitioners in the art who are not familiar with patent or legal terms or phraseology, to determine quickly from a cursory inspection the nature and essence of the technical disclosure of the application.

While the invention has been described in connection with what is presently considered to be the most practical and various embodiments, it is to be understood that the invention is not to be limited to the disclosed embodiments, but on the contrary, is intended to cover various modifications and equivalent arrangements included within the scope of the appended claims.

This written description uses examples to disclose the invention, including the best mode, and also to enable any person skilled in the art to practice the invention, including making and using any devices or systems and performing any incorporated methods. The patentable scope the invention is defined in the claims, and may include other examples that occur to those skilled in the art. Such other examples are intended to be within the scope of the claims if they have structural elements that do not differ from the literal language of the claims, or if they include equivalent structural elements within substantial differences from the literal languages of the claims.

What is claimed is:

1. A wearable device for multimedia communications, the device comprising:

a power supply;

a stereo communication link configured to communicate at least one of audio signals and video signals over a channel; and a belt associated with a buckle for securing the device around the wrist or waist of a user, wherein the belt includes a plurality of holes for securing buckle components including:

a housing, a capturing means affixed to the housing, the capturing means adapted to record video;

a sound output means affixed to the housing, the sound output means configured to play audio responsive to the audio signals communicated over the channel;

a display affixed to the housing, the display configured to play video responsive to the video signals communicated over the channel;

a microphone configured to communicate a microphone signal over the channel;

a wired connector communicably coupled to the stereo communication link, said wired connector including a USB connection configured to transfer data and power to the device; and a user interface configured to operate the device;

wherein the stereo communication link includes a wireless portion configured to wirelessly communicate the at least one of audio signals and video signals over the channel to a controller;

wherein the user interface is voice operated;

wherein the user interface is physically decoupled from the housing;

wherein the user interface is further configured to operate the device;

wherein the stereo communications link includes a wireless transceiver configured to receive the at least one of the audio signals and the video signals from a signal source physically decoupled from the device;

wherein the wireless transceiver is configured to make a Bluetooth connection; and wherein the display is configured to exhibit both still and video images.

2. The device of claim 1, wherein the capturing means is a camera, and the sound output means is a built in speaker for playing audio and video sound.

3. The device of claim 1, further comprising a microphone configured to communicate a microphone signal over the channel.

4. The device of claim 1, the stereo communication link includes a wireless portion configured to wirelessly communicate the at least one of audio signals and video signals over the channel to a controller including a user interface.

5. The device of claim 1, wherein the stereo communication link includes a wireless portion configured to wirelessly communicate the at least one of audio signals and video signals over the channel to at least one of the headgears.

6. The device of claim 1, further comprising a wired connector communicably coupled to the stereo communication link, the wired connector including a USB connection configured to transfer data and power to the device.

7. The device of claim 1, further comprising a user interface configured to operate the device, the user interface is voice operated and the user interface is further configured to operate the capturing means to record and capture the video.

8. The device of claim 7, wherein the user interface is physically decoupled from the housing.

9. The device of claim 7, wherein the user interface is further configured to play independent audio and video content in the sound output means.

10. The device of claim 1, wherein the sound output means are configured to switch between communicating audio signals and video signals.

11. The device of claim 1, wherein the stereo communications link includes a wireless transceiver configured to receive the at least one of the audio signals and the video signals from a signal source physically decoupled from the device.

12. The device of claim 11, wherein the wireless transceiver is configured to make a Bluetooth connection.

13. The device of claim 1, wherein the display is configured to exhibit both still and video images.

14. The device of claim 1, further comprising a storage means for storing audios and videos.

15. The device of claim 1, further comprising set of instructions; and wherein the device is arranged as a kit.

16. A system for playing multimedia, the system comprising:

a multimedia communications device including a power supply, a stereo communication link configured to communicate at least one of audio signals and video signals over a channel;

a belt with a buckle including configured to be worn by a user, the belt with the buckle including a housing, a speaker affixed to the housing to play audio responsive to the audio signals communicated over the channel, a display affixed to the housing, the display configured to play video responsive to the video signals communicated over the channel;

a controller including a user interface, the controller configured to communicate the at least one of audio signals and video signals to the multimedia communications device and further configured as a telephony device; and wherein the belt with a buckle is adapted to record video via a capturing means and display images and videos played here on the controller including the user interface to the display, the belt with a buckle further comprising a sound output means for playing audio and video.

17. The system of claim 16, wherein the controller is a mobile communication device.

18. The system of claim 16, wherein the capturing means is a camera and the sound output means is a built-in speaker in the belt buckle.

19. A method for playing multimedia on a wearable device, the method comprising:

providing a multimedia communications device including a power supply, a stereo communication link configured to communicate at least one of audio signals and video signals over a channel;

a belt with a buckle including configured to be worn by a user, the belt with the buckle including a housing, a speaker affixed to the housing to play audio responsive to the audio signals communicated over the channel, a display affixed to the housing, the display configured to play video responsive to the video signals communicated over the channel;

providing a controller including a user interface, said controller configured to communicate the at least one of audio signals and video signals to the multimedia communications device and further configured as a telephony device;

communicably coupling the multimedia communications device with the controller; and communicating audio signals and video signals from the controller to the multimedia communications device;

playing audio signals on the sound output means;

playing video signals on the display;

adapting a belt with a buckle to record video via a capturing means and display images and videos played here on the controller including the user interface to the display of the belt with a buckle; and conducting a phone call via the to the multimedia communications device.

* * * * *